US006788240B2

(12) United States Patent
Reyneri et al.

(10) Patent No.: US 6,788,240 B2
(45) Date of Patent: Sep. 7, 2004

(54) SINGLE-CHIP MASSIVELY PARALLEL ANALOG-TO-DIGITAL CONVERSION

(76) Inventors: Justin Reyneri, 881 Highlands Cir., Los Altos, CA (US) 94024; David Xiao Dong Yang, 2020 California St., Mountain View, CA (US) 94306

( * ) Notice: Subject to any disclaimer, the term of this patent is extended or adjusted under 35 U.S.C. 154(b) by 0 days.

(21) Appl. No.: 10/618,398

(22) Filed: Jul. 11, 2003

(65) Prior Publication Data

US 2004/0008136 A1 Jan. 15, 2004

Related U.S. Application Data

(62) Division of application No. 10/146,875, filed on May 15, 2002, now abandoned.

(51) Int. Cl.[7] .................................................. H03M 1/36
(52) U.S. Cl. ...................................... 341/159; 341/155
(58) Field of Search ................................ 341/155, 159, 341/156, 162, 158

(56) References Cited

U.S. PATENT DOCUMENTS

| 5,150,313 A | 9/1992 | van den Engh et al. .... 364/569 |
| 5,465,093 A | 11/1995 | Kusumoto et al. .......... 341/122 |
| 5,736,951 A | * 4/1998 | Kobatake ..................... 341/159 |
| 5,801,657 A | 9/1998 | Fowler et al. ............... 341/155 |
| 6,037,890 A | * 3/2000 | Glass et al. .................. 341/159 |
| 6,160,508 A | 12/2000 | Gustavsson et al. ........ 341/155 |
| 6,392,575 B1 | 5/2002 | Eklund ........................ 341/141 |
| 6,525,682 B2 | 2/2003 | Yap et al. .................... 341/137 |

\* cited by examiner

*Primary Examiner*—Brian Young

(57) ABSTRACT

A circuit includes an input terminal coupled to receive an analog input signal, a multiple number of sample-and-hold circuits and a multiple number of analog-to-digital (A/D) converters. The input terminal of each of the sample-and-hold circuits is coupled to receive the analog input signal. Each of the A/D converters has an input terminal and an output terminal, where the input terminal is coupled to an output terminal of a corresponding one of the sample-and-hold circuits. In operation, the sample-and-hold circuits sample the analog input signal sequentially and store a multiple number of analog samples at each of the sample-and-hold circuits. The A/D converters convert the analog samples in parallel to generate digital values at the output terminals of each of the A/D converters representative of each of the analog samples. In one embodiment, the A/D converters are implemented based on a multi-channel bit-serial (MCBS) analog-to-digital conversion scheme.

26 Claims, 8 Drawing Sheets

SINGLE-CHIP MASSIVELY PARALLEL ANALOG-TO-DIGITAL CONVERSION

CROSS REFERENCE TO RELATED APPLICATION

This application is a divisional of application Ser. No. 10/146,875, filed May 15, 2002, now abandoned entitled "Single-chip Massively Parallel Analog-to-Digital Conversion" of the same inventors hereof, which application is incorporated herein by reference in its entirety.

FIELD OF THE INVENTION

The invention relates to analog-to-digital conversion circuits, and more particularly to a high speed analog-to-digital conversion circuit using a massively parallel analog-to-digital conversion technique.

DESCRIPTION OF THE RELATED ART

Analog-to-digital conversion (ADC) is performed to convert an analog signal to a digital number indicative of the amplitude of the analog signal. The digital number is typically digital code in 4-bit to 10-bit depending on the precision of the conversion. Analog-to-digital conversion is performed by sampling the analog signal at a predetermined frequency and converting the amplitude of the sampled signal to a digital number representative of the amplitude. The speeds of the analog-to-digital conversion typically range from 15 to 300 megasamples per second (MSPS). To accurately represent an analog signal in digital form, the analog signal must be sampled at at least twice the highest frequency present in the analog signal. Therefore, for a high frequency signal, such as a 200 MHz analog signal, the speed of the ADC conversion must be at least 400 MSPS to provide an accurate representation.

Analog-to-digital conversion is commonly used in applications such as audio signal processing, video and medical imaging and high speed communications. The analog signals are converted to digital representations so that subsequent digital signal processing (DSP) techniques can be applied to the digital data. DSP techniques for processing digital data can include data compression, noise filtering, data storage, noiseless transmission of data, and digital encryption of data.

For applications operating at very high frequency or very high transmission rate, a high speed (e.g. 400 MSPS) analog-to-digital (A/D) converter is needed to ensure accurate conversion. Such high speed A/D converters are typically very complex and complicated to design. A single-chip high speed A/D converter can be quite large and can consume large amount of power in operation. It is desirable to provide a high speed A/D converter that is smaller and simple to design so that power consumption and manufacturing cost can be reduced.

SUMMARY OF THE INVENTION

In accordance with one embodiment of the present invention, a circuit includes an input terminal coupled to receive an analog input signal, a multiple number of sample-and-hold circuits and a multiple number of analog-to-digital (A/D) converters. The input terminal of each of the sample-and-hold circuits is coupled to the input terminal of the circuit receiving the analog input signal. Each of the A/D converters has an input terminal and an output terminal, where the input terminal is coupled to an output terminal of a corresponding one of the sample-and-hold circuits. In operation, the sample-and-hold circuits sample the analog input signal sequentially and store a multiple number of analog samples at each of the sample-and-hold circuits. The A/D converters convert the analog samples in parallel to generate digital values at the output terminals of each of the A/D converters representative of the analog samples.

In one embodiment, the A/D converters are implemented based on a multi-channel bit-serial (MCBS) analog-to-digital conversion scheme. Each A/D converter includes a comparator receiving a first signal having a number of levels and a latch receiving and a series of binary signals. The A/D converter operates to convert the analog sample to a digital code representation.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

In accordance with the principles of the present invention, an analog-to-digital (A/D) converter includes multiple A/D converter elements configured to perform analog-to-digital conversion of an analog signal in a massively parallel fashion. In one embodiment, the A/D converter elements are low-speed A/D converters having a conversion rate of about 50 MSPS or less. The A/D converter of the present invention can achieve high speed conversion by performing multiple conversions in parallel using low-speed A/D converters. Because low-speed A/D converters are simpler to implement and because control circuitry can be shared among the multiple A/D converter elements, the A/D converter of the present invention can be made smaller in size and with fewer transistors than conventional high speed A/D converters. Accordingly, the A/D converter of the present invention consumes less power and reduces the manufacturing cost. Furthermore, the use of multiple low-speed A/D converters reduces the design complexity of the A/D converter so that single-chip high speed A/D converters in different configurations can be readily constructed in accordance with the principles of the present invention.

Figure 1:
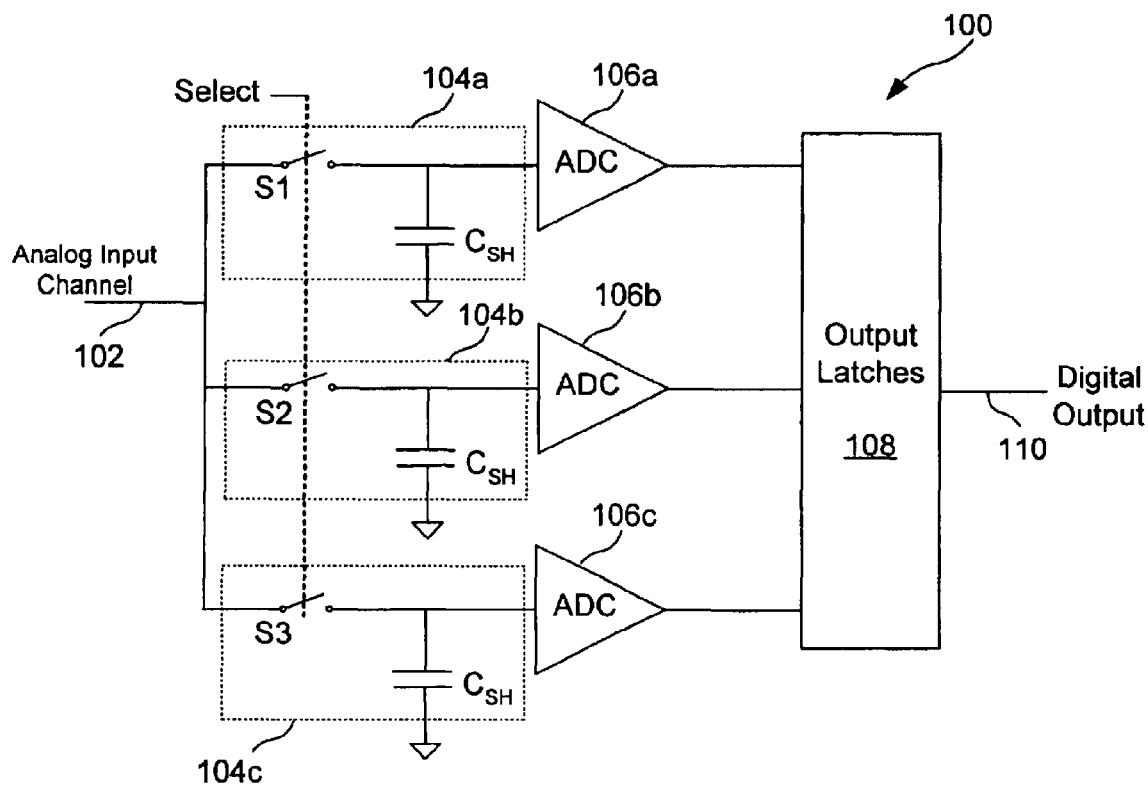
FIG. 1 is a schematic diagram of an A/D converter according to one embodiment of the present invention.

FIG. 1 is a schematic diagram of an A/D converter according to one embodiment of the present invention. Referring to FIG. 1, A/D converter 100 includes an array of sample-and-hold circuits 104a to 104c and an array of A/D converter elements 106a to 106c. An output terminal of each sample-and-hold circuit is coupled to the input terminal of a corresponding A/D converter element. In the present embodiment, each of sample-and-hold circuits 104a to 104c includes a switch (S1–S3) and a capacitor $C_{SH}$. A/D converter 100 includes one input channel 102 for receiving an analog signal and generates a digital output on output bus 110. In the present embodiment, A/D converter 100 provides digital data representing the analog input signal in a bit-serial format. In other embodiments, A/D converter 100 can provide the digital data in a parallel format where the databits are provided on output bus 110 simultaneously. Typically, A/D converter 100 is fabricated as a single integrated circuit having an input pin receiving the analog input signal and an output pin or an output bus providing the digital output.

Sample-and-hold circuits 104a to 104c operate in a conventional manner under the control of a select signal. In the present embodiment, the select signal causes switches S1 to S3 to close sequentially so that the analog input signal is sampled at three consecutive sampling times. At each of the sampling time, the amplitude of the analog input signal is stored on the respective capacitor $C_{SH}$. After the analog input signal have been sampled by sample-and-hold circuits 104a to 104c, A/D converter elements 106a to 106c operate to convert each sample in parallel to generate a digital output indicative of the amplitude of the sampled analog signal. In the present embodiment, the output terminals of A/D converter elements 106a–106c are coupled to an array of output latches 108 which operates to transfer the digital output signals from each of A/D converter elements 106a to 106c onto output bus 110.

Each of A/D converter elements 106a to 106c can be constructed as a low-speed A/D converter. Because the analog input signal in input channel 102 is being sampled and digitally converted in parallel at three sampling times by A/D converter elements 106a to 106c, A/D converter 100 can achieve an effective conversion rate that is three times the conversion rate of each of the converter element. For example, A/D converter elements 106a to 106c can each have a conversion rate of only 20 MSPS. A/D converter 100 will have an effective conversion rate of 60 MSPS. By providing a large number of A/D converter elements to convert the analog input signal in parallel, A/D converter 100 can realize a very high conversion rate. In the present illustration, A/D converter 100 includes only three A/D converter elements. In other embodiments, A/D converter 100 may include a large number of converter elements to realize a high A/D conversion rate.

Figure 2:
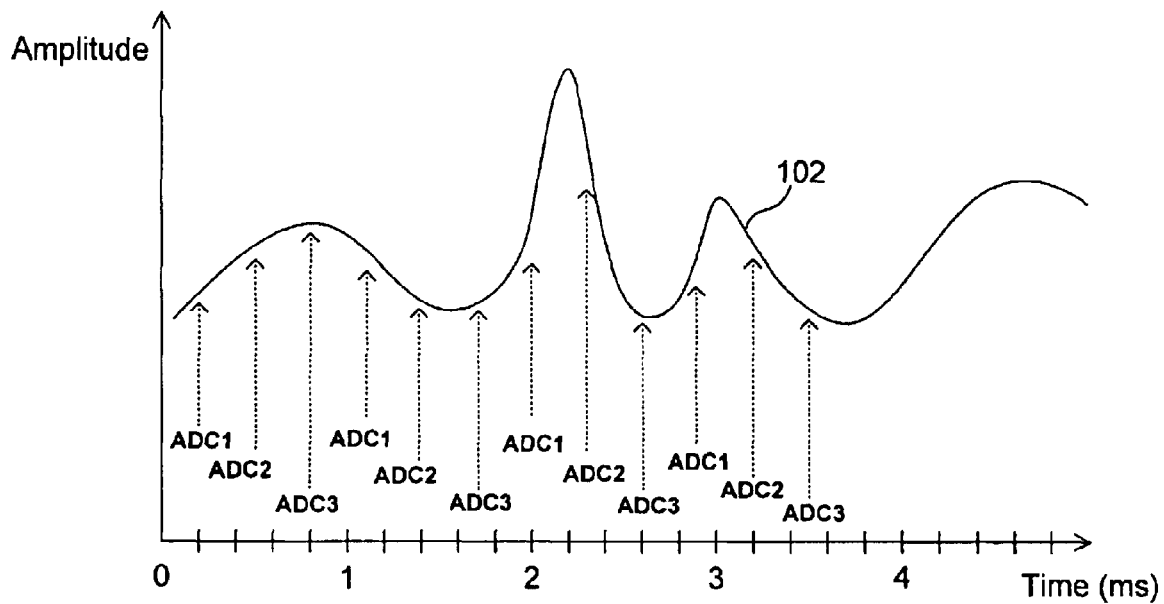
FIG. 2 is a diagram illustrating a representative analog input signal and the operation of the A/D converter of the present invention.

FIG. 2 is a diagram illustrating a representative analog input signal and the operation of the A/D converter of the present invention. Referring to FIG. 2, an analog signal 120 is being converted by A/D converter 100 of FIG. 1. At the start of the analog to digital conversion process, the analog input signal 120 is sampled by sample-and-hold circuit 104a to 104c in sequence. Then A/D converter elements 106a to 106c operate to convert the analog samples to digital output. Then, the process repeats where analog input signal 120 is sampled again and digitally converted again by A/D converter 100. In the present illustration, even though each A/D converter element has a conversion rate of only 1000 samples per second, the effective conversion rate for A/D converter 100 is 3000 samples per second as analog input signal 120 is continuously being sampled and converted in parallel by sample-and-hold circuits 104a to 104c and A/D converter elements 106a to 106c.

As described above, A/D converter elements 106a to 106c can be constructed as any low-speed ADC converters. For instance, an A/D converter having a conversion rate of less than about 50 MSPS can be used. Low-speed ADC converters are preferred in the A/D converter of the present invention because low-speed A/D converters tend to be smaller and less complicated to design and implement. In accordance with one embodiment of the present invention, the A/D converter elements are constructed based on a multi-channel bit-serial (MCBS) analog-to-digital conversion scheme. MCBS analog-to-digital conversion is described in U.S. Pat. No. 5,801,657 of Fowler et al. ("the '657 patent"). The MCBS ADC scheme described in the '657 patent can significantly improve the overall system performance while minimizing the size of the A/D converters. The '657 patent is incorporated herein by reference in its entirety.

Figure 3:
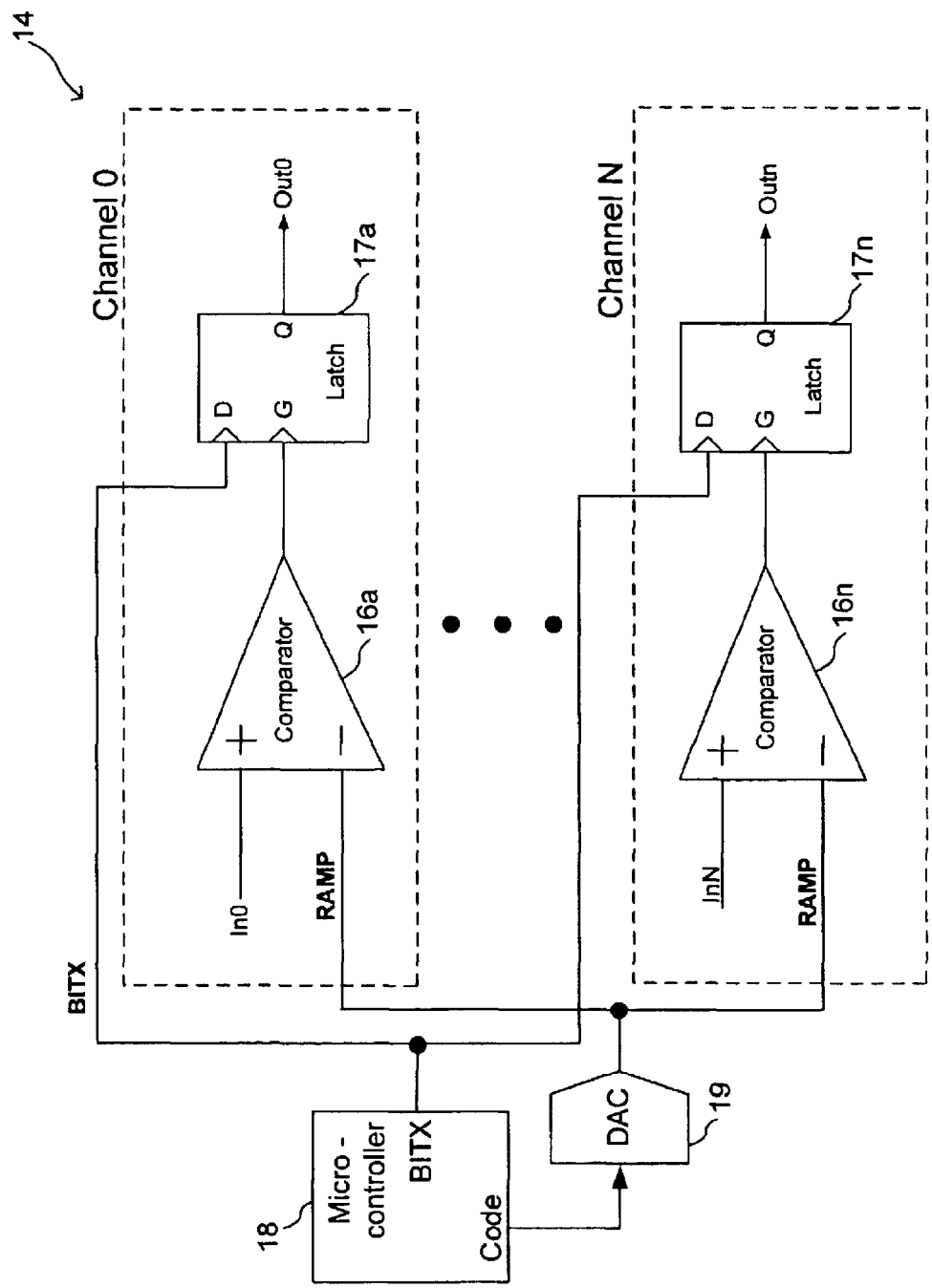
FIG. 3 is a schematic diagram illustrating the basic architecture of the MCBS ADC technique.

FIG. 3 replicates FIG. 1A of the '657 patent and illustrates the basic architecture of the MCBS ADC technique. In FIG. 3, A/D converter 14 includes a multiple number of conversion channels, such as Channel 0 to Channel N, where each conversion channel is associated with an analog input signal In0 to InN. Each conversion channel contains a 1-bit comparator 16a–n and a 1-bit latch 17a–n. Comparators 16a–n and latches 17a–n are controlled by external control signals RAMP and BITX. The two control signals are generated by a micro-controller 18 and a digital-to-analog (D/A) converter 19 and are broadcasted to all conversion channels, i.e., Channel 0 to Channel N.

The MCBS ADC scheme of the '657 patent provides several advantages. First, because all conversion channels are operated simultaneously, maximum throughput can be achieved. Second, because each conversion channel uses simple circuitry, i.e. each input channel includes only one 1-bit comparator and one 1-bit latch, the A/D converter consumes minimum circuit area in implementation. Furthermore, because the more complicated control circuitry, such as micro-controller 18, are shared among all conversion channels, the overhead of the control circuitry is spread among all of the conversion channels. These advantages make MCBS A/D converter suitable for use in digitizing systems for converting a very large number of analog signals in parallel.

In accordance with the present invention, instead of applying the multi-channel bit-serial (MCBS) analog-to-digital conversion technique to the conversion of a very large number of analog signals simultaneously, the MCBS ADC technique is applied to the conversion of one or a few analog signals for realizing a very fast conversion rate. In one embodiment of A/D converter 100, each A/D converter element is implemented as one conversion channel of the MCBS A/D converter. The control circuitry, such as the microcontroller and the DAC, is shared among all the A/D converter elements. Because each conversion channel of an MCBS A/D converter can be made very small (22 transistors per converter on the average), the A/D converter of the present invention can be constructed on a single integrated circuit ("a chip") even when the A/D converter has a very large number of A/D converter elements.

Figure 4:
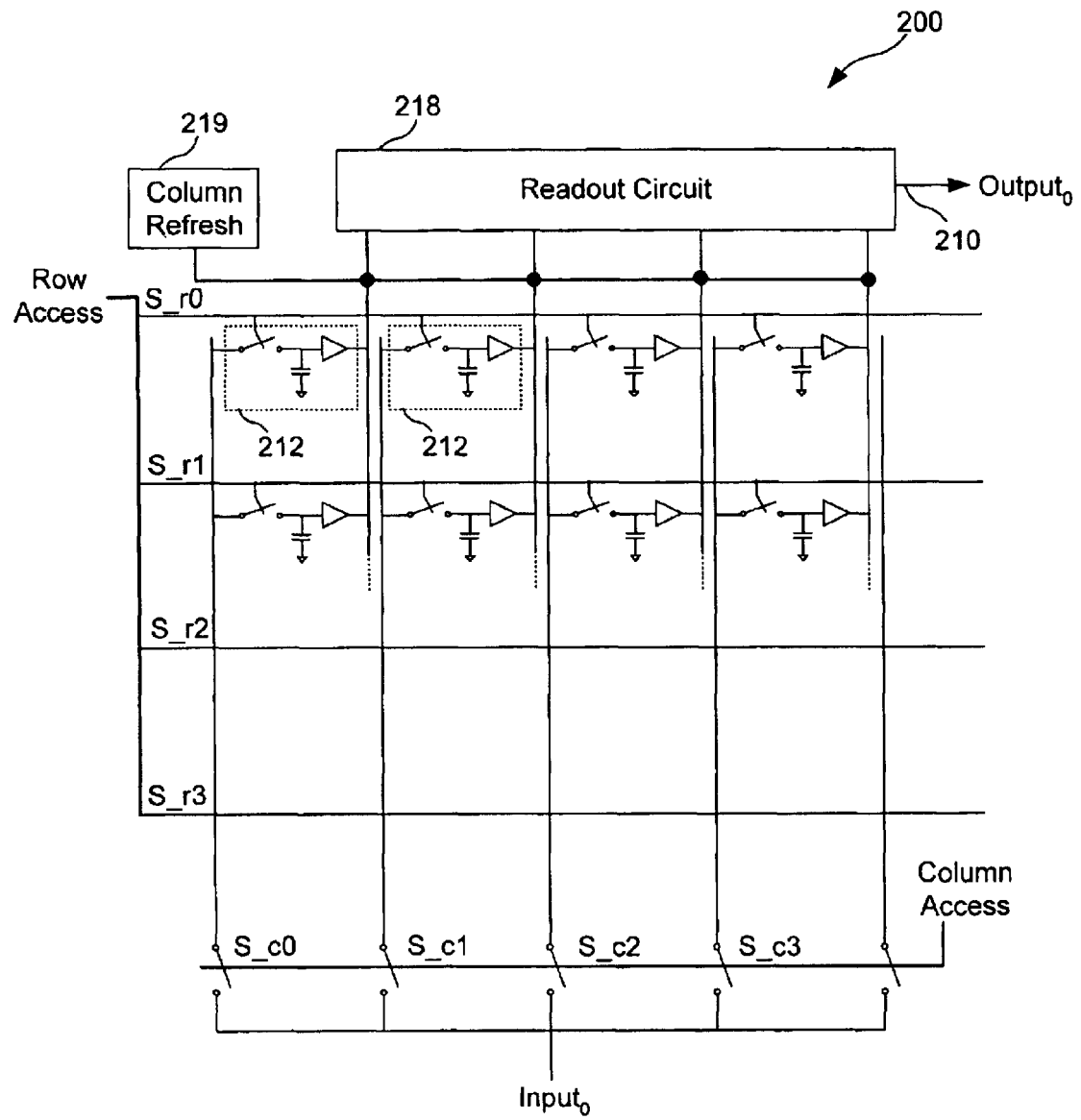
FIG. 4 is a schematic diagram illustrating an A/D converter including a two-dimensional array of A/D converter elements according to one embodiment of the present invention.

FIG. 4 is a schematic diagram illustrating an A/D converter including a two-dimensional array of A/D converter elements according to one embodiment of the present invention. Referring to FIG. 4, A/D converter 200 includes a two-dimensional array of ADC cells 212. Each ADC cell includes a sample-and-hold circuit coupled to an A/D converter element. Specifically, in each ADC cell, an output terminal of a sample-and-hold circuit is coupled to an input terminal of an A/D converter element. Each ADC cell 212 operates to sample the analog input signal and covert the analog sample to a digital output. In the present embodiment, A/D converter 200 includes only one input channel, receiving an analog input signal Input0, and provides a digital output, Output0, on an output bus 210.

The number of ADC cells in A/D converter 200 of the present invention can vary depending on the application the A/D converter is used. However, because each A/D converter element is small in size, A/D converter 200 can include up to millions of ADC cells to achieve a very high conversion rate. Because the sample-and-hold circuit typically operates at a much faster speed than an A/D converter, the A/D converter of the present invention is able to sample and hold a large number of samples of an analog signal for parallel conversion using the array of A/D converter elements. In this manner, very high speed analog-to-digital conversion can be achieved even when the individual A/D converter element has a low conversion rate. In the present embodiment, A/D converter 200 includes an array of one million ADC cells. Each A/D converter element can operate at a rate of 1000 conversions per second. Therefore, A/D converter 200 can realize an aggregate conversion rate of 1000×1 million=1 billion conversions per second.

As described above, because each A/D converter element can be constructed as a low-speed A/D converters and is thus small in size, the entire array of ADC cells can be fabricated on a single integrated circuit. In the present embodiment, A/D converter elements in A/D converter 200 are constructed based on the MCBS ADC technique. Thus, each A/D converter element is implemented as one conversion channel of the MCBS A/D converter. Because each conversion channel can be implemented using very few transistors (e.g. 5.5 transistors on average), A/D converter 200 can be manufactured as a single chip high speed analog-to-digital conversion circuit including at least 1 million A/D converter elements.

In operation, analog input signal Input0 is provided to A/D converter 200. The analog input signal is sequentially sampled by each of the sample-and-hold circuits until a sample of the analog input signal is loaded into each of the ADC cells 212. Then A/D converter 200 activates the A/D converter elements in each of the ADC cells to perform massively parallel analog-to-digital conversion of the sampled signals. A/D converter 200 includes a readout circuit 218 for reading out the digital output from each of the A/D converter elements sequentially. In the present embodiment, the digital output is provided on output bus 210 as Output0 in serial format. Alternately, the digital output can be provided on output bus 210 in parallel format.

In the present embodiment, the array of ADC cells is addressed using a column access and row access addressing scheme commonly used in random access memory (RAM) circuits. The use of a conventional memory accessing scheme has the advantage of allowing a large number of cells to be loaded without degrading the analog input signal. The column access signal and the row access signal operate to ensure that each ADC cell samples the analog input signal sequentially in a predetermined order so that a very high speed analog-to-digital conversion can be realized. A/D converter 200 may include other supporting circuitry to facilitate the loading of the ADC cells and the reading of the converted signals from each A/D cell. For example, a column refresh circuit 219 may be included to precharge the bitlines (the output signal lines) coupled to the output terminals of the A/D cells. The operation of the column refresh circuit to refresh bitlines and facilitate readout of signals in a memory array is well known in the art of memory design.

Figure 5:
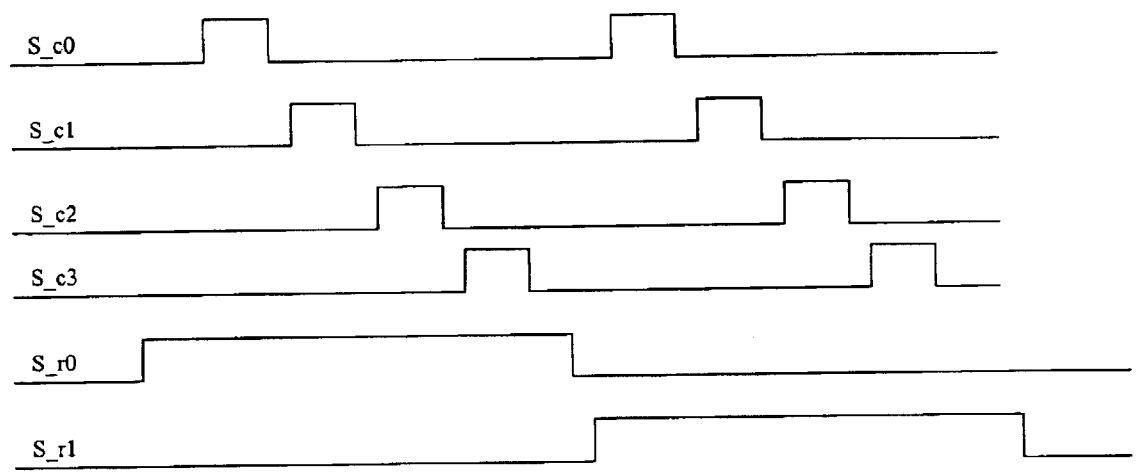
FIG. 5 is a timing diagram illustrating the row access signal and column access signal for controlling the A/D converter of FIG. 4 according to one embodiment of the present invention.

FIG. 5 is a timing diagram illustrating the waveform of the row access signals and column access signals for controlling A/D converter 200 according to one embodiment of the present invention. Referring to FIG. 5, the row access signal S_r0, controlling the first row of ADC cells, is first activated to enable the first row of ADC cells to sample the analog input signal. Then, the column access signals S_c0, S_c1, S_c2, and S_c3 are activated sequentially so that each of the ADC cells in the first row of A/D converter 200 samples the analog input signal at a different but sequential time interval. After the first row of ADC cells has sampled the analog input signal, row access signal S_r0 is deactivated and row access signal S_r1, controlling the second row of ADC cells, is activated. The column access signals S_c0, S_c1, S_c2, and S_c3 are again activated sequentially to enable the ADC cells in the second row of A/D converter 200 to sample the analog input signal. The operation of the row access signals and column access signals allows the entire array of ADC cells to sequentially sample the analog input signal so that analog-to-digital conversion can be carried out in a massively parallel manner.

Figure 8:
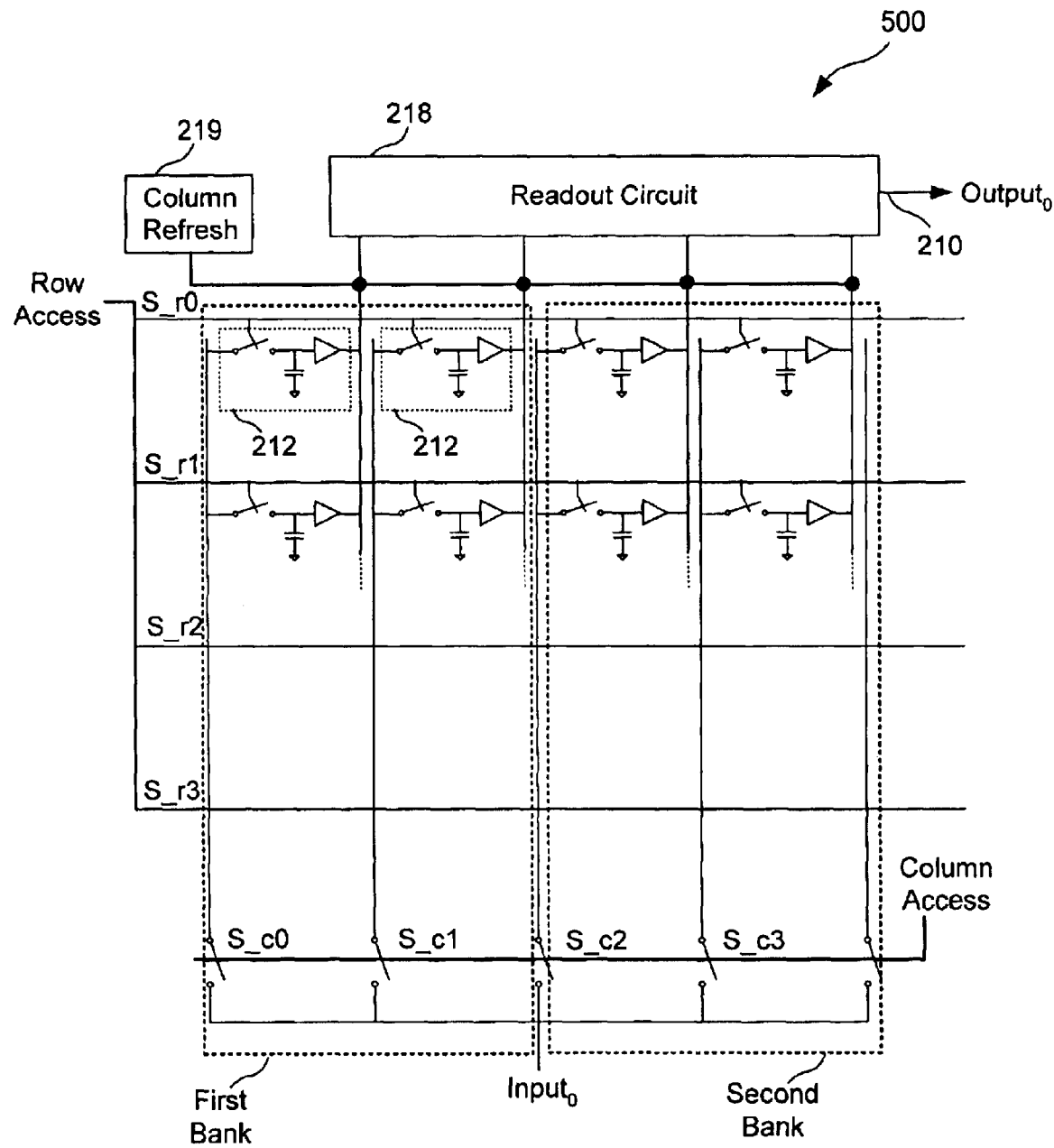
FIG. 8 is a schematic diagram illustrating an A/D converter including a two-dimensional array of A/D converter elements according to an alternate embodiment of the present invention.

According to one embodiment of the present invention (illustrated in FIG. 8), the array of ADC cells in A/D converter 200 may be divided into two banks to facilitate readout of the digital output from the A/D converter elements. Thus, in operation, digital output can be read out from the first bank of ADC cells while the second bank of the ADC cells is sampling and converting the analog input signal, and vice versa. In this manner, the speed of the analog-to-digital conversion is increased because the ADC converter alternates between the two banks of ADC cells so that one bank of ADC cells is always generating digital output.

Figure 9:
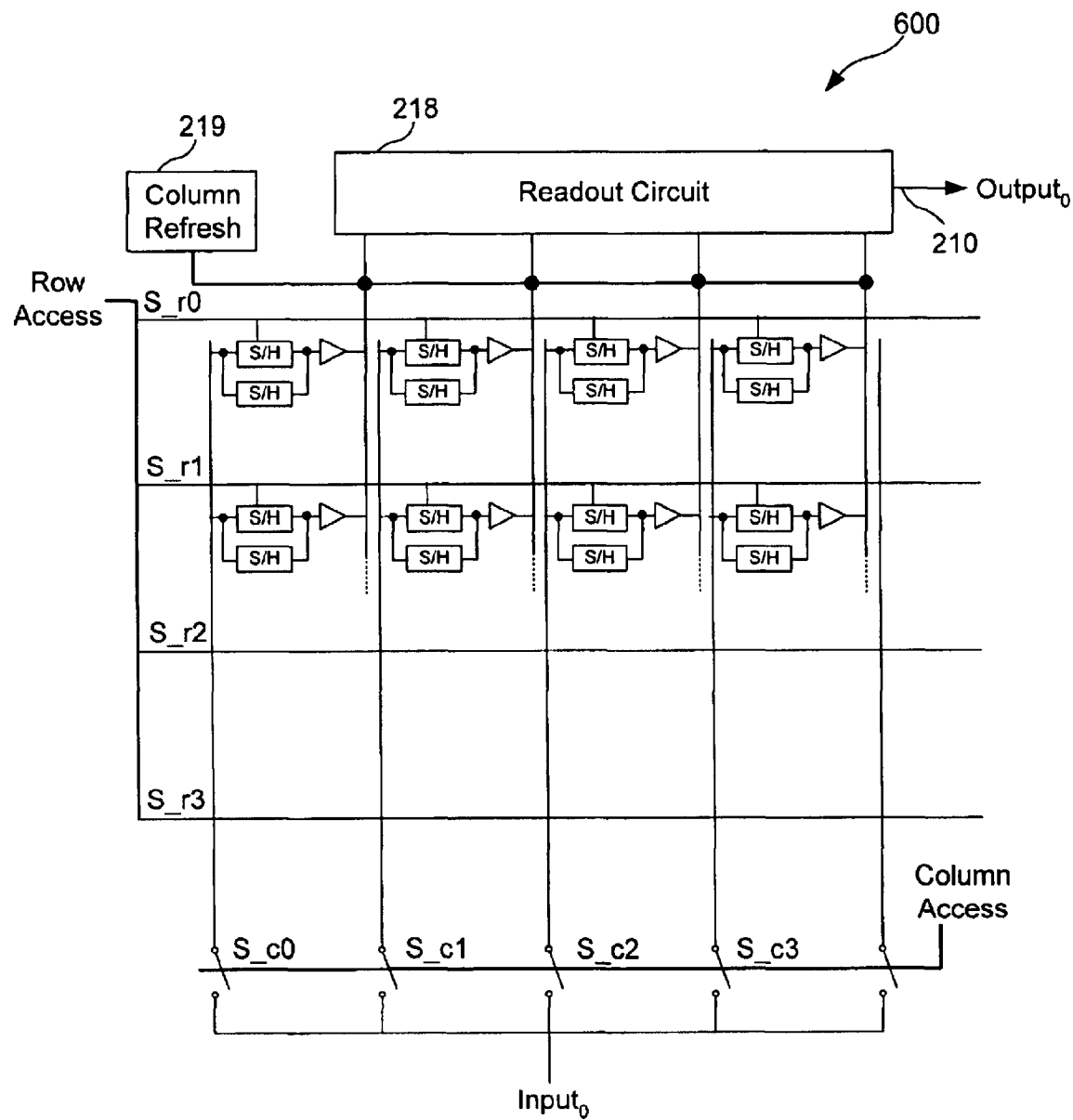
FIG. 9 is a schematic diagram illustrating an A/D converter including a two-dimensional array of A/D converter elements according to an alternate embodiment of the present invention.

In an alternate embodiment (illustrated in FIG. 9), each ADC cell 212 of A/D converter 200 may further include a second sample-and-hold circuit coupled in parallel to the first sample-and-hold circuit. The two sample-and-hold circuits operate in concert to eliminate dead time during which the A/D converter elements wait for the next set of samples to be processed. In operation, the first sample-and-hold circuit in each of the ADC cells samples the analog input signal and provides the first analog sample to the A/D converter element. While the A/D converter element is converting the first analog sample, the second sample-and-hold circuit in each of the ADC cells samples the analog input signal to collect a second analog sample. When the A/D converter element has completed the conversion of the first analog sample, the A/D converter element can immediately proceed to convert the second analog sample stored at the second sample-and-hold circuit. In this manner, the A/D converter element can be operated continuously to convert analog samples stored in each of the first and second sample-and-hold circuits.

Figure 6:
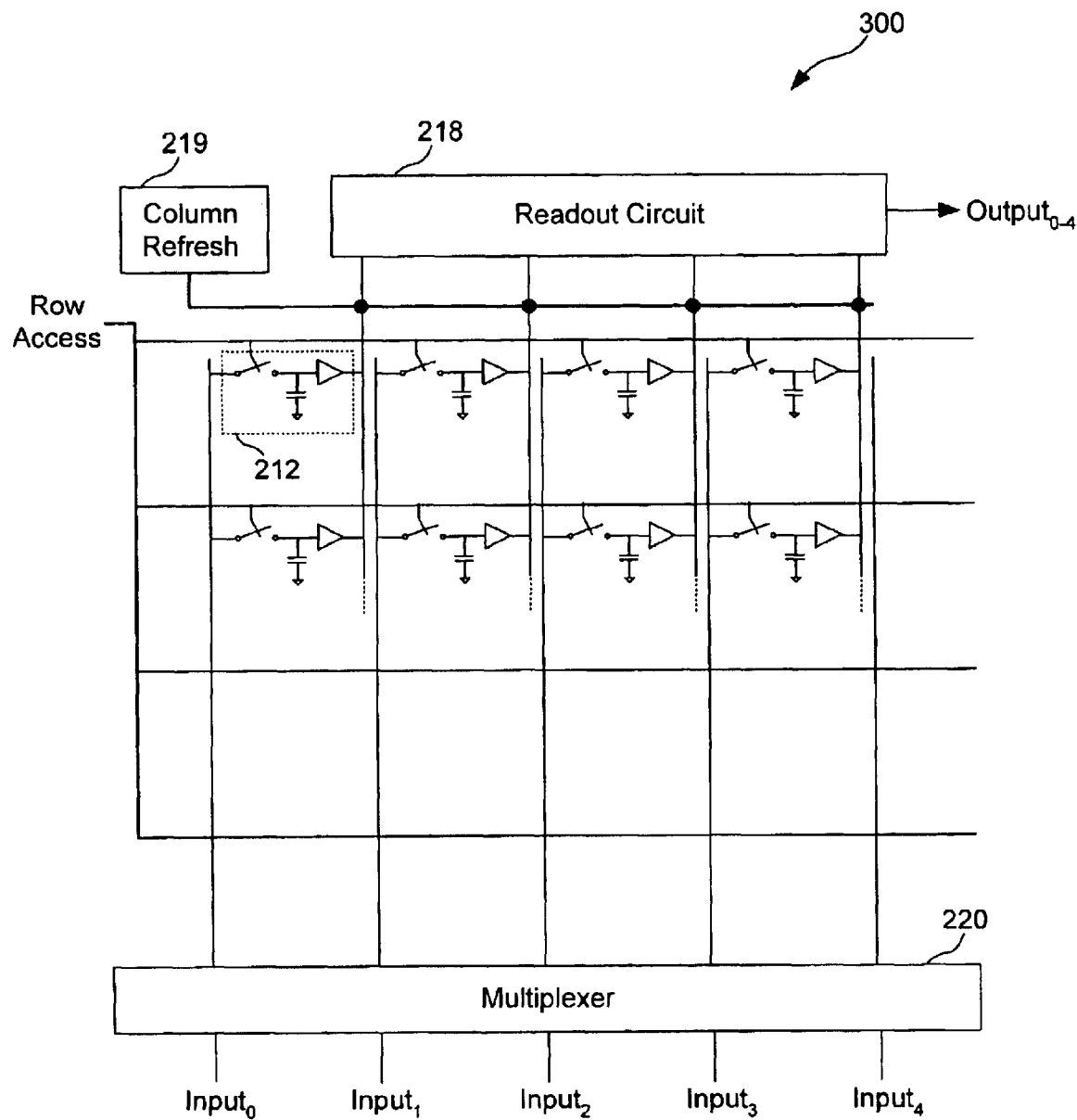
FIG. 6 is a schematic diagram illustrating an A/D converter according to another embodiment of the present invention.

FIG. 6 is a schematic diagram illustrating an A/D converter according to another embodiment of the present invention. Like elements in FIGS. 4 and 6 are given like reference numerals to simplify the discussion. Referring to FIG. 6, A/D converter 300 includes a two dimensional array of ADC cells 212 and readout circuit 218 for sampling and converting analog signals in a massively parallel fashion. A/D converter 300 is different from A/D converter 200 in that A/D converter 300 includes multiple input channels. In the present embodiment, A/D converter 300 includes five input channels, Input0 to Input4, for receiving five analog input signals. A multiplexer 220, such as a programmable multiplexer, is used to select the different input channels for coupling to the array of ADC cells.

In one embodiment, multiplexer 200 operates to select one input channel to be processed by the entire array of ADC cells. For each input channel, a very high conversion rate can be realized. In another embodiment, the array of ADC cells is divided into banks where each bank of ADC cells is associated with one input channel. In this manner, each input channel is provided with dedicated analog-to-digital conversion capability. Although the conversion rate for each channel is reduced when the A/D converter includes dedicated banks of ADC cells, the conversion rate for each input channel can still be very high as long as sufficient number of A/D converter elements is included in each bank. For instance, when A/D converter 300 includes 100 input channels and 1 million ADC cells, each A/D converter element having a conversion rate of 1000 conversions per second, A/D converter 300 can still realize 10 millions conversions per input channel per second. The improvement in conversion rate in a multi-channel A/D converter of the present invention is still significantly increased from conventional A/D converters.

Figure 7:
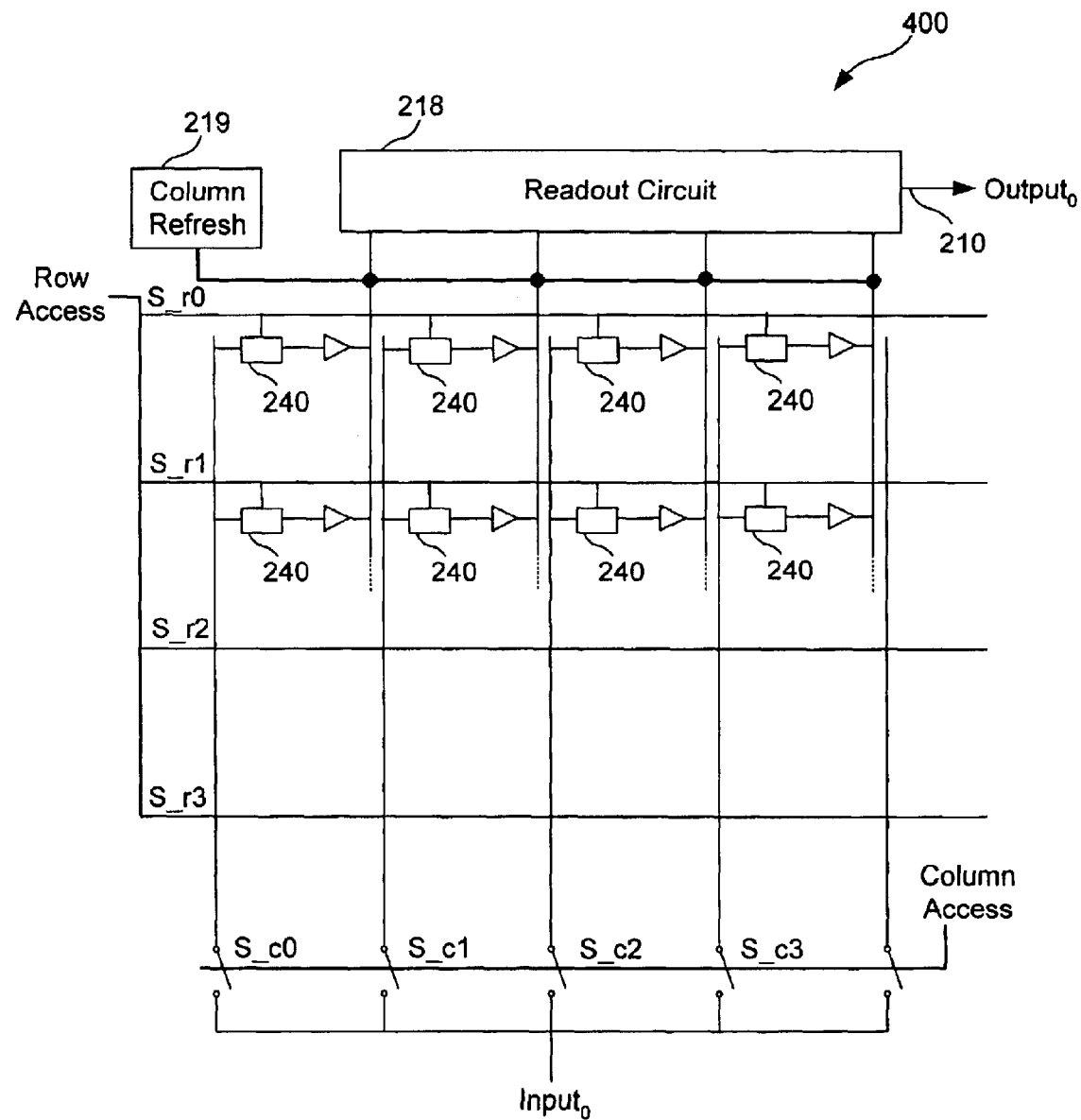
FIG. 7 is a schematic diagram illustrating an A/D converter including a two-dimensional array of A/D converter elements according to an alternate embodiment of the present invention.

According to another embodiment of the present invention (illustrated in FIG. 7), an analog shift register can be used in place of the sample-and-hold circuit in each of the ADC cells of the A/D converter of the present invention. Referring to FIG. 7, an array of analog shift registers 240 can be used to load samples of the analog input signal sequentially into each ADC cell. The array of ADC cells can then perform analog-to-digital conversion in a massively parallel fashion. The analog shift registers must operate fast enough to ensure that the array of ADC cells can be loaded in a time shorter than the conversion time of the A/D converter element. The speed of the analog shift registers may limit the number of ADC cells that can be integrated in an A/D converter of the present invention. Alternately, signal buffering or boosting can be included to recover the signal integrity and to speed up the shifting operation so that analog shift registers can be applied in a large array of ADC cells.

The A/D converter of the present invention has numerous applications where high speed analog-to-digital conversion is performed. For instance, the A/D converter of the present invention can be used in digital televisions for converting analog video signals, in satellite TV decoders, in digital video recorders, in digital oscilloscopes and in digital network switches.

The above detailed descriptions are provided to illustrate specific embodiments of the present invention and are not intended to be limiting. Numerous modifications and variations within the scope of the present invention are possible. The present invention is defined by the appended claims.

We claim:

1. A circuit comprising:
   an input terminal coupled to receive an analog input signal;
   a plurality of sample-and-hold circuits, an input terminal of each of said plurality of sample-and-hold circuits coupled to said input terminal; and
   a plurality of analog-to-digital (A/D) converters, each of said plurality of A/D converters having an input terminal and an output terminal, said input terminal being coupled to an output terminal of a corresponding one of said plurality of sample-and-hold circuits,
   wherein said plurality of sample-and-hold circuits and said plurality of A/D converters are arranged in a two-dimensional array of ADC cells, each ADC cell including one of said plurality of sample-and-hold circuits coupled to one of said plurality of A/D converters, each ADC cell in said two-dimensional array of ADC cells being addressed by a row access signal and a column access signal; and
   wherein said plurality of sample-and-hold circuits sample said analog input signal sequentially, storing a plurality of analog samples at each of said plurality of sample-and-hold circuits; and said plurality of A/D converters convert said plurality of analog samples in parallel to generate digital values at said output terminals representative of said analog samples.

2. The circuit of claim 1, further comprises:
   a first signal generator for generating a first signal having a plurality of levels; and
   a binary signal generator for generating a series of binary signals,
   wherein each of said plurality of A/D converters comprises:
   a comparator having a first input terminal connected to receive said first signal, said comparator having a second input terminal connected to receive said analog sample of said analog input signal to be converted into a digital value; and
   a latch having a first input terminal coupled to receive an output signal of said comparator, said latch having a data input terminal coupled to receive said series of binary signals, an output signal of said comparator controlling when said latch provides an output signal corresponding to a binary signal applied to said data input terminal,
   wherein said latch provides at least a portion of an N-bit digital code representing said analog sample applied to said second input terminal of said comparator.

3. The circuit of claim 1, wherein each of said plurality of sample-and-hold circuits comprises:
   a switch having an input terminal coupled to receive said analog input signal and an output terminal, said switch being controlled by a select signal; and
   a capacitor coupled to said output terminal of said switch.

4. The circuit of claim 1, further comprises:
   an output readout circuit coupled to each of said output terminal of said plurality of A/D converters, said output readout circuit coupled to transmit sequentially said digital values from each of said plurality of A/D converters onto an output bus.

5. The circuit of claim 4, wherein said plurality of sample-and-hold circuits and said plurality of A/D converters are divided into a first bank and a second bank of sample-and-hold circuits and A/D converters, and said output readout circuit alternates between said first bank and said second bank for receiving digital values from each of said plurality of A/D converters.

6. The circuit of claim 1, wherein said digital values are provided in a bit-serial format.

7. The circuit of claim 1, wherein said digital values are provided in a parallel format.

8. The circuit of claim 1, further comprises:
a second plurality of sample-and-hold circuits, each of said second plurality of sample-and-hold circuits being coupled in parallel to a respective one of said plurality of sample-and-hold circuits,
wherein said plurality of sample-and-hold circuits and said second plurality of sample-and-hold circuits operate alternately to sample said analog input signal at different sampling times.

9. The circuit of claim 1, wherein said input terminal is a plurality of input terminals, each of said plurality of input terminals coupled to receive an analog input signal, said circuit further comprises:
a multiplexer coupled to said plurality of input terminals, said multiplexer selecting one of said plurality of input terminals to be coupled to said plurality of sample-and-hold circuits.

10. The circuit of claim 1, wherein said plurality of sample-and-hold circuits and said plurality of A/D converters are fabricated on a single integrated circuit.

11. A circuit comprising:
an input terminal coupled to receive an analog input signal; and
a two dimensional array of ADC cells, each ADC cell including a sample-and-hold circuit coupled to an A/D converter, said array of ADC cells being addressed by a plurality of access signals,
wherein said plurality of access signals selects each sample-and-hold circuit in said array of ADC cells in sequence to cause said sample-and-hold circuits to sample said input analog signal at a plurality of sampling times and store a plurality of analog samples, and said A/D converters in said array of ADC cells convert said plurality of analog samples in parallel to generate digital values representative of said analog samples.

12. The circuit of claim 11, further comprises:
a first signal generator for generating a first signal having a plurality of levels; and
a binary signal generator for generating a series of binary signals,
wherein each of said A/D converters in said array of ADC cells comprises:
a comparator having a first input terminal connected to receive said first signal, said comparator having a second input terminal connected to receive said analog sample of said analog input signal to be converted into a digital value; and
a latch having a first input terminal coupled to receive an output signal of said comparator, said latch having a data input terminal coupled to receive said series of binary signals, an output signal of said comparator controlling when said latch provides an output signal corresponding to a binary signal applied to said data input terminal,
wherein said latch provides at least a portion of an N-bit digital code representing said analog sample applied to said second input terminal of said comparator.

13. The circuit of claim 11, wherein each of said sample-and-hold circuits in said array of ADC cells comprises:

a switch having an input terminal coupled to receive said analog input signal and an output terminal, said switch being controlled by at least one of said plurality of access signals; and
a capacitor coupled to said output terminal of said switch.

14. The circuit of claim 11, further comprises:
an output readout circuit coupled to output terminals of said A/D converters in said array of ADC cells, said output readout circuit coupled to transmit said digital values from each of said plurality of A/D converters onto an output bus.

15. The circuit of claim 14, wherein said array of ADC cells is divided into a first bank and a second bank of ADC cells, and said output readout circuit alternates between said first bank and said second bank for receiving digital values from each of said plurality of A/D converters.

16. The circuit of claim 11, wherein said digital values are provided in a bit-serial format.

17. The circuit of claim 11, wherein said digital values are provided in a parallel format.

18. The circuit of claim 11, wherein each ADC cell further comprises a second sample-and-hold circuit coupled in parallel to said sample-and-hold circuit, said sample-and-hold circuit and said second sample-and-hold circuit in each ADC cell operate alternately to sample said analog input signal at different sampling times.

19. The circuit of claim 11, wherein said input terminal is a plurality of input terminals, each of said plurality of input terminals coupled to receive an analog input signal, said circuit further comprises:
a multiplexer coupled to said plurality of input terminals, said multiplexer selecting one of said plurality of input terminals to be coupled to said array of ADC cells.

20. The circuit of claim 19, wherein said array of ADC cells is divided into a plurality of banks of ADC cells, each bank of ADC cells being associated with one of said input terminals, and said multiplexer selects one of said plurality of input terminals to be coupled to an associated bank of ADC cells.

21. The circuit of claim 11, wherein said array of ADC cells is fabricated on a single integrated circuit.

22. A circuit comprising:
an input terminal coupled to receive an analog input signal;
a plurality of analog shift registers, an input terminal of each of said plurality of analog shift registers coupled to said input terminal; and
a plurality of analog-to-digital (A/D) converters, each of said plurality of A/D converters having an input terminal and an output terminal, said input terminal being coupled to an output terminal of a corresponding one of said plurality of analog shift registers,
wherein said plurality of analog shift registers and said plurality of A/D converters are arranged in a two-dimensional array of ADC cells, each ADC cell including one of said plurality of analog shift registers coupled to one of said plurality of A/D converters, each ADC cell in said two-dimensional array of ADC cells being addressed by a row access signal and a column access signal; and
wherein said plurality of analog shift registers sample said analog input signal sequentially, storing a plurality of analog samples at each of said plurality of analog shift registers; and said plurality of A/D converters convert said plurality of analog samples in parallel to generate digital values at said output terminal representative of said analog samples.

23. The circuit of claim 22, further comprises:

a first signal generator for generating a first signal having a plurality of levels; and a binary signal generator for generating a series of binary signals, wherein each of said plurality of A/D converters comprises:

a comparator having a first input terminal connected to receive said first signal, said comparator having a second input terminal connected to receive said analog sample of said analog input signal to be converted into a digital value; and a latch having a first input terminal coupled to receive an output signal of said comparator, said latch having a data input terminal coupled to receive said series of binary signals, an output signal of said comparator controlling when said latch provides an output signal corresponding to a binary signal applied to said data input terminal, wherein said latch provides at least a portion of an N-bit digital code representing said analog sample applied to said second input terminal of said comparator.

24. A method for performing analog-to-digital conversion comprising:

providing a two-dimensional array of ADC cells, each ADC cell including a sample-and-hold circuit coupled to an A/D converter and being addressed by a row access signal and a column access signal;

receiving an analog input signals to be converted into a digital value;

sampling said analog input signal using said two dimensional array of ADC cells, said analog input signal being sampled sequentially at a plurality of sampling times to generate a plurality of analog samples, each analog sample being stored at a respective one of said sample-and-hold circuit in a respective ADC cell;

coupling each of said plurality of analog samples to a corresponding input terminal of a respective one of said A/D converters in said two-dimensional array of ADC cells; and converting said plurality of analog samples to digital values at each of said A/D converters in said two-dimensional array of ADC cells.

25. The method of claim 24, wherein said converting said plurality of analog samples to digital values at each of said A/D converters in said two-dimensional array of ADC cells comprises converting said plurality of analog samples to digital values in parallel.

26. The method of claim 24, wherein said converting said plurality of analog samples to digital values at each of said A/D converters in said two-dimensional array of ADC cells comprises:

receiving a first signal having a plurality of levels;

coupling each of said plurality of analog samples to a corresponding input terminal of a comparator in a corresponding A/D converter;

at each comparator, comparing said first signal to said analog sample and outputting a comparison result;

receiving a series of binary signals at a plurality of latches; and at each latch, applying said comparison result to a first input of said latch, and applying said series of binary signals to a data input of said latch, a logic level of said comparison result controlling when said latch provides an output signal corresponding to a binary signal applied to said data input, wherein said latch provides at least a portion of an N-bit digital code representing at least one of said analog samples.

* * * * *